United States Patent
Sun et al.

(10) Patent No.: US 9,240,440 B1
(45) Date of Patent: Jan. 19, 2016

(54) METHOD MINIMIZING IMPRINT THROUGH PACKAGING OF F-RAM

(71) Applicant: Cypress Semiconductor Corporation, San Jose, CA (US)

(72) Inventors: Shan Sun, Colorado Springs, CO (US); Robert Sommervold, Colorado Springs, CO (US); Thomas E. Davenport, Denver, CO (US); Donald J. Verhaeghe, Colorado Springs, CO (US)

(73) Assignee: Cypress Semiconductor Corporation, San Jose, CA (US)

( * ) Notice: Subject to any disclaimer, the term of this patent is extended or adjusted under 35 U.S.C. 154(b) by 225 days.

(21) Appl. No.: 13/924,292

(22) Filed: Jun. 21, 2013

(51) Int. Cl.
*G01R 31/02* (2006.01)
*H01L 49/02* (2006.01)
*G01R 31/28* (2006.01)

(52) U.S. Cl.
CPC ............ *H01L 28/40* (2013.01); *G01R 31/2872* (2013.01)

(58) Field of Classification Search
None
See application file for complete search history.

(56) References Cited

U.S. PATENT DOCUMENTS

| | | | | |
|---|---|---|---|---|
| 5,525,528 | A * | 6/1996 | Perino et al. | 438/3 |
| 6,238,933 | B1 * | 5/2001 | Sun et al. | 438/3 |
| 6,294,393 | B1 * | 9/2001 | Higgins et al. | 438/4 |
| 2004/0266028 | A1 * | 12/2004 | Rodriguez et al. | 438/3 |
| 2009/0316469 | A1 * | 12/2009 | Rodriguez et al. | 365/145 |

* cited by examiner

*Primary Examiner* — Minh N Tang

(57) ABSTRACT

A method of minimizing imprint in a ferroelectric capacitor uses a gradually attenuated AC field to electrically depolarize the ferroelectric capacitor before being packaged. The AC field is linearly attenuated, and generated using a series of voltage pulses, down to a minimum allowed voltage. A final pulse is a positive voltage to minimize hydrogen degradation during packaging. Thermal depoling can also be used.

15 Claims, 6 Drawing Sheets

CONVENTIONAL F-RAM TEST AND PACKAGING FLOW

NEW TEST AND PACKAGING FLOW

METHOD MINIMIZING IMPRINT THROUGH PACKAGING OF F-RAM

BACKGROUND

The present invention is related to ferroelectric memories, and more specifically, to a depolarization technique used for minimizing imprint in the ferroelectric memories.

In ferroelectric capacitors in ferroelectric memories, polarization is switched from one state to the other with an applied electric field. The desired behavior is that the polarization will switch easily from one state to the other, regardless of how long the first state has been stored or what its storage temperature profile has been. But in real-world parts, some capacitors will have a tendency to favor the state they have been storing for a long time. This is known as imprint as the state stored becomes imprinted onto the polarization orientation. If a capacitor becomes imprinted, it will be more difficult to write the new opposite state when desired. In extreme cases, the capacitor may not be able to switch to the opposite state.

High temperature excursions while a capacitor is polarized can accelerate imprint. The temperature range required for packaging is such an excursion that can accelerate imprint. Imprint caused by assembly can have a yield impact. Polarization is the driving force for imprint. By depolarizing the capacitors before packaging, imprint can be significantly reduced and yield and reliability improved.

FIGS. 1(a)-1(c), entitled "Polarization Configurations", show three polarization configurations for a ferroelectric capacitor.

In FIG. 1(a), a Thermally Depolarized PZT Ferroelectric Capacitor (>400° C.) shows that the polarization vectors are randomly oriented. Thermal depolarization further means that the polarizations are randomly oriented and the net polarization is zero. It is the most effective and complete way to depolarize a ferroelectric capacitor. However, it requires high temperatures that might generate changes to the product and impact the performance of the circuits. Another limitation of thermal depolarization is that there is no selectivity and every ferroelectric capacitor is depolarized. In a more advanced ferroelectric device, some ferroelectric capacitors are used for storing engineering and configuration information, and such data should never be changed or lost.

In FIG. 1(b), a net polarization in a Polarized Ferroelectric Capacitor leads to imprint during the process that the device is packaged. The thermal budget of package assembly is equivalent to ~185° C. for 4 hours. Although the parts are not powered up, a net polarization exists in the ferroelectric capacitors due to using the conventional testing process. The polarization vectors are always the same as the polarity of the last electric pulse to polarize the capacitor during wafer test.

In FIG. 1(c), an Electrically Depolarized Ferroelectric Capacitor shows a desired net zero polarization of the ferroelectric capacitor. Since the polarization is the driving force for imprint, zero net polarization or much reduced polarization will eliminate or reduce imprint during packaging. This invention teaches how to eliminate or reduce polarization by thermal depolarization and electrical depolarization.

SUMMARY

A method of minimizing imprint in a ferroelectric capacitor comprises a depolarization before package. Depolarization can be achieved by thermal depolarization and electrical depolarization. Thermal depolarization is conducted by exposing wafers to a relatively high temperature for a short time. Electrical depolarization is performed by applying a gradually attenuated AC field to the ferroelectric capacitor before being packaged. The AC field is linearly attenuated, and generated using a series of voltage pulses, down to a minimum allowed voltage. An alternative two-pulse (strong and weak) electrical depolarization method is also disclosed. A final pulse is a weak positive voltage to minimize hydrogen degradation during packaging.

BRIEF DESCRIPTION OF THE DRAWINGS

The aforementioned and other features and objects of the present invention and the manner of attaining them will become more apparent and the invention itself will be best understood by reference to the following description of a preferred embodiment taken in conjunction with the accompanying drawings, wherein.

DETAILED DESCRIPTION

Figure 1A:
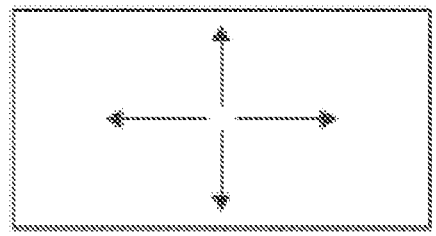
FIGS. 1(a)-1(c) are plots of three polarization configurations for a ferroelectric capacitor in a ferroelectric memory.
Figure 1B:
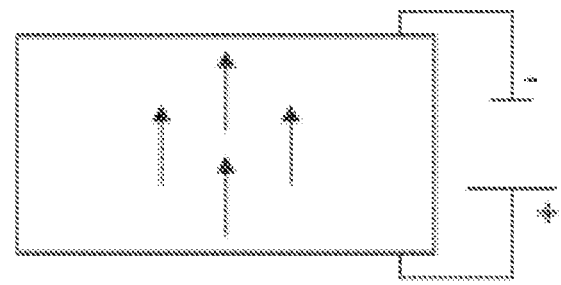
Figure 1C:
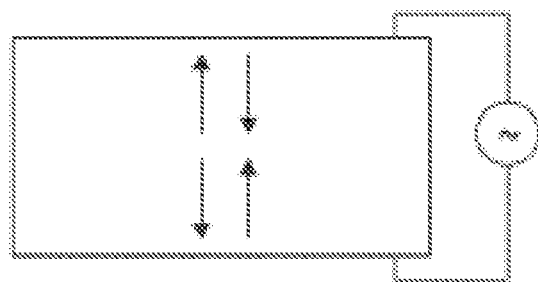
Figure 2A:
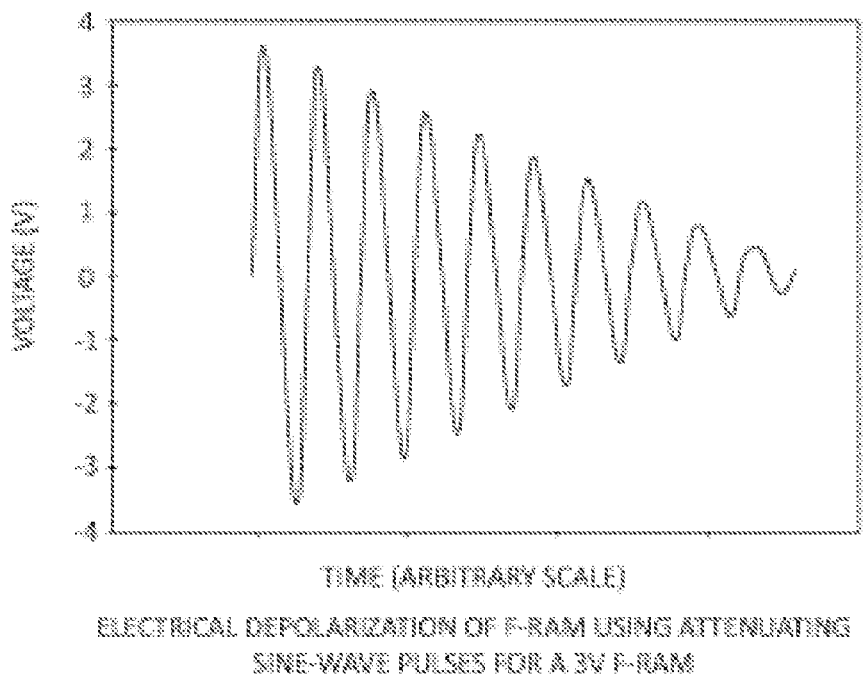
FIGS. 2(a)-2(e) are plots of waveforms that can be used to electrically depole ferroelectric capacitors according to an embodiment of the present invention.
Figure 2B:
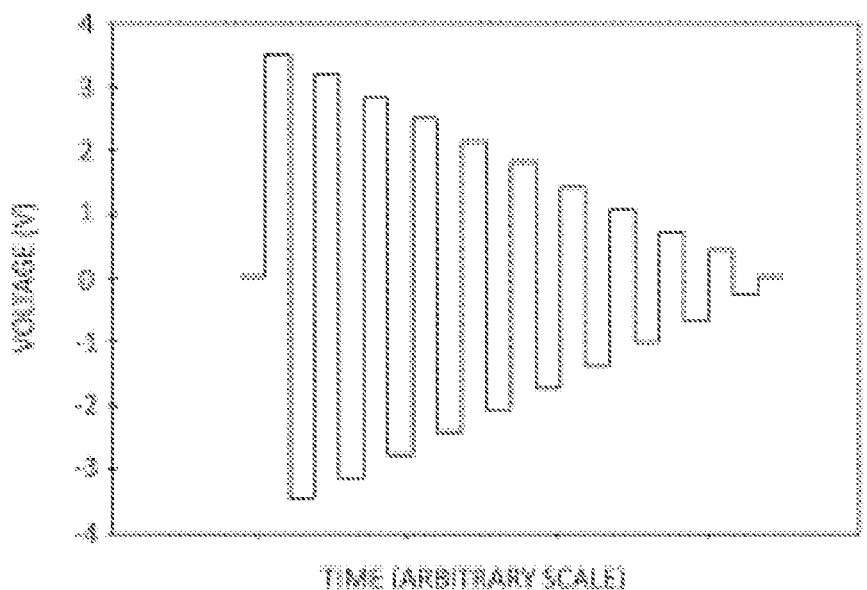
Figure 2C:
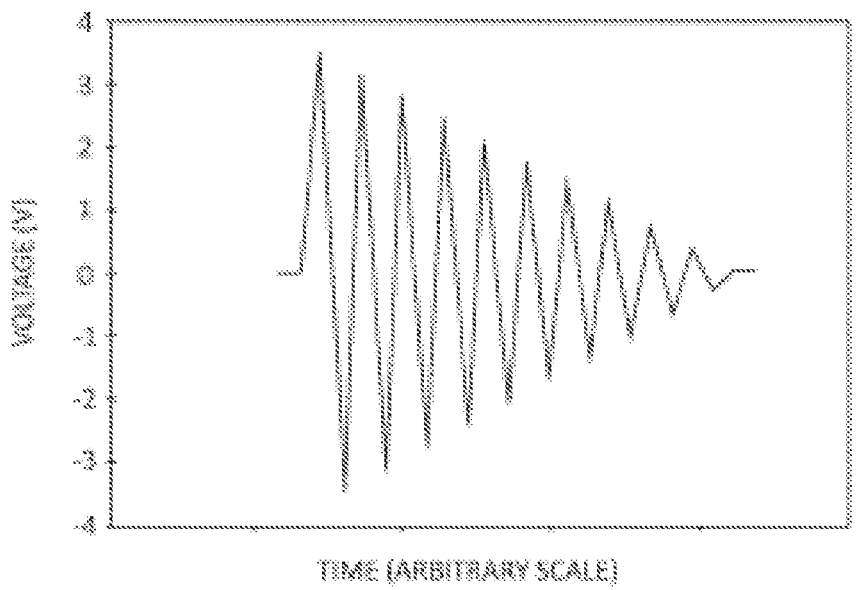
Figure 2D:
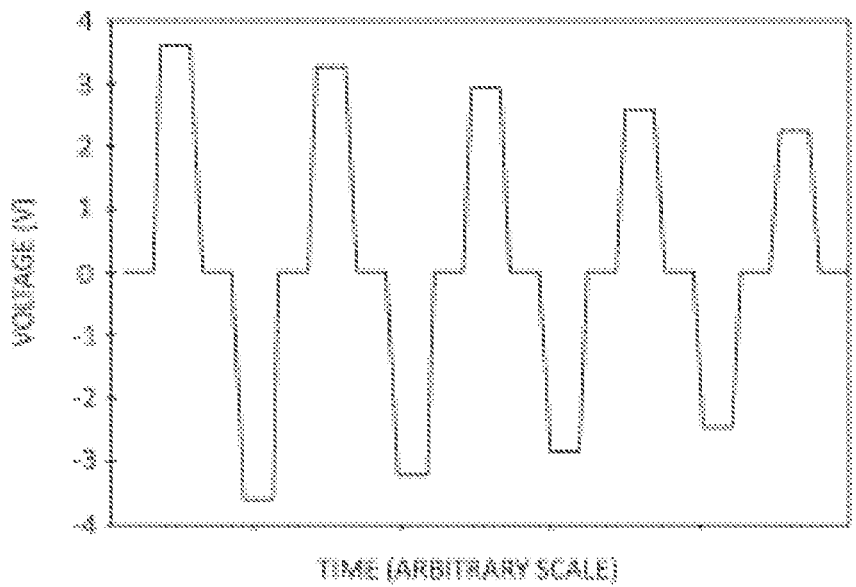
Figure 2E:
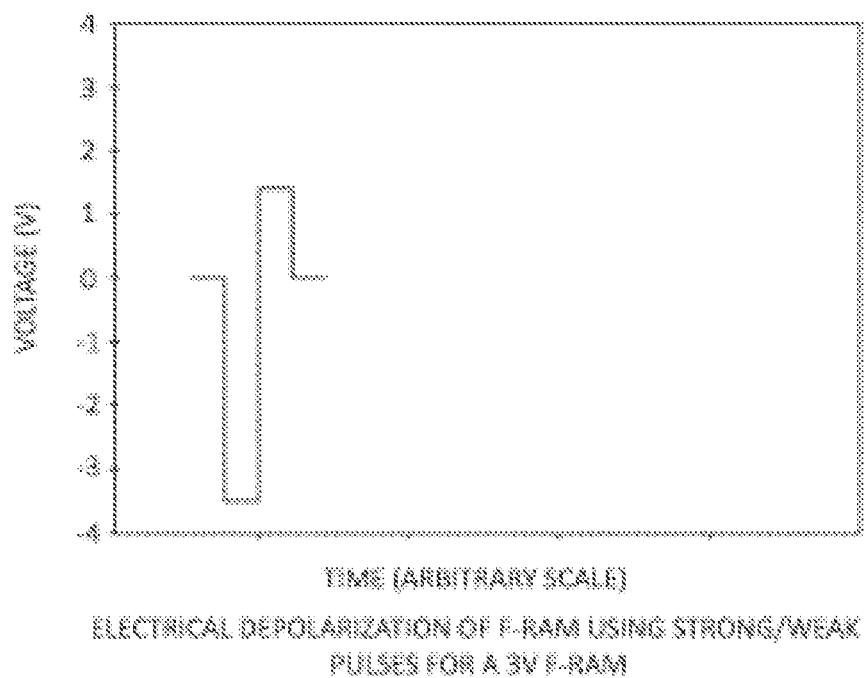

FIGS. 2(a), 2(b), 2(c) and 2(d) show linearly attenuated sinusoidal, square, and triangular waveforms that can be used for electrically depoling the ferroelectric capacitor in a 1T/1C memory cell according to an embodiment of the present invention. While the gradually Attenuated AC Field as shown in FIGS. 2(a)-(d) can be used for depoling according to an embodiment of the present invention, the more easily generated two pulses (strong and weak) can also be used as shown in FIG. 2(e). FIG. 2(a) illustrates an electrical depolarization waveform using gradually attenuated sine wave voltage pulses for a 3V F-RAM memory. FIG. 2(b) illustrates an electrical depolarization waveform using attenuating square-wave pulses for a 3V F-RAM memory. FIG. 2(c) illustrates an electrical depolarization waveform using gradually attenuated triangle wave pulses for a 3V F-RAM memory. FIG. 2(d) illustrates an electrical depolarization waveform using gradually attenuated square wave voltage pulses for a 3V F-RAM memory. FIG. 2(e) illustrates an electrical depolarization waveform using a strong/weak pulse sequence for a 3V F-RAM memory.

Figure 3A:
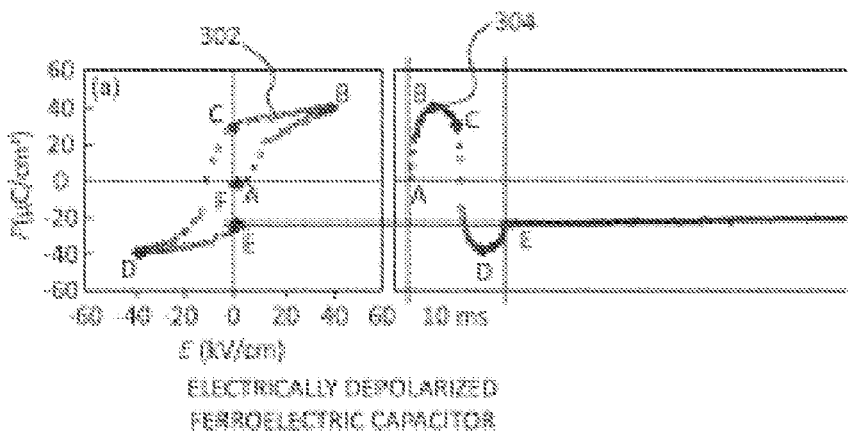
FIGS. 3(a)-3(c) are plots of three hysteresis loops having different starting points, and an accompanying plot of polarization versus time.
Figure 3B:
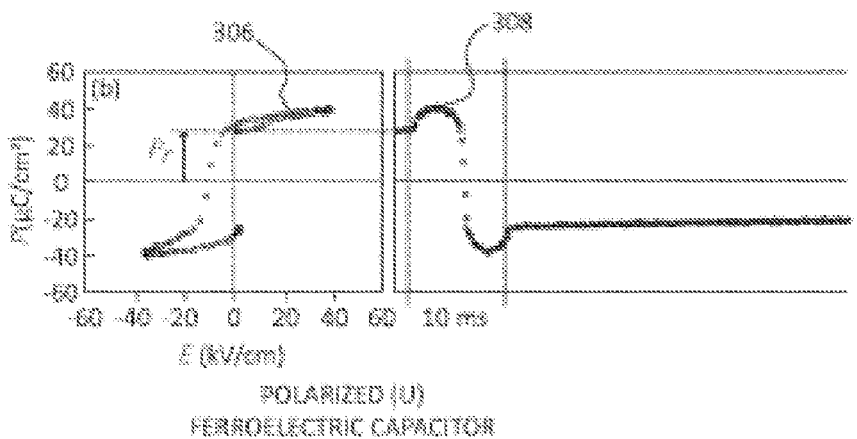
Figure 3C:
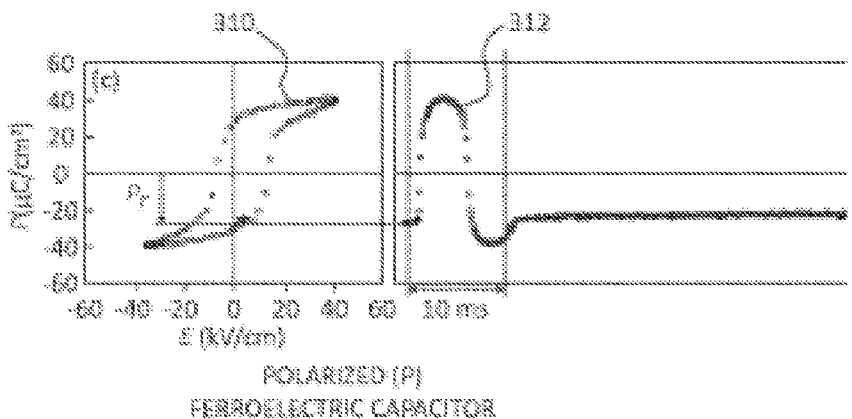

The sequence of FIGS. 3(a)-3(c) is entitled "Hysteresis Loops", and shows a hysteresis loop and corresponding polarization versus time.

FIG. 3(a) shows a hysteresis loop 302 for an Electrically Depolarized Ferroelectric Capacitor wherein the starting point A is zero (net zero polarization). The corresponding polarization versus time graph 304 is also shown through hysteresis graph points A, B, C, D, and E.

FIG. 3(b) shows a hysteresis loop 306 for a Polarized (U) Ferroelectric Capacitor wherein the starting point is up (net up polarization). The corresponding polarization versus time graph 308 is also shown through hysteresis graph points A, B, C, D, E, and F.

FIG. 3(c) shows a hysteresis loop 310 for a Polarized (P) Ferroelectric Capacitor wherein the starting point is down (net down polarization). The corresponding polarization versus time graph 312 is also shown.

The significance of FIGS. 3(a)-3(c) is explained in further detail below. If the depolarization waveforms of FIGS. 2(a)-2(c) are used, the ferroelectric capacitor will be completely depolarized and the net polarization is zero. FIG. 3(a) shows a hysteresis loop for an electrically depolarized ferroelectric capacitor. The hysteresis loop starts from zero indicating there was no net polarization post electrical depolarization and the electrical depolarization is completed and successful. FIGS. 3(b) and (c) show the hysteresis loops that do not start from zero since the capacitors are polarized with a positive remanant polarizations in FIG. 2(b) and a negative remanant polarizations in FIG. 2(c).

Figure 4:
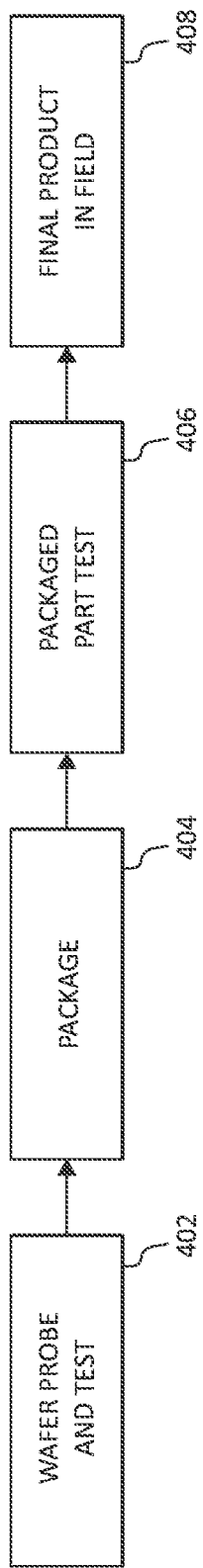
FIG. 4 is a conventional ferroelectric memory test and packaging flow.

FIG. 4 is entitled "Conventional F-RAM Test and Packaging Flow". It is a flow chart of a conventional flow including Wafer probe and test 402, Package 404, Packaged Part Test 406, and Final Product in Field 408. The packaging process is equivalent to 185° C. bake for four hours. Ferroelectric capacitors polarized during wafer probe and test will be imprinted through packaging and the signal margin and data retention time of the final products will be greatly reduced. It is therefore desirable to minimize the polarization vector at the end of wafer probing. Two techniques are available to achieve this end: thermal depoling and electrical depoling. To thermally depolarize the PZT capacitors, a predetermined temperature should be higher than packaging temperature in order to achieve the expected results. Ideally it should be above the Curie temperature of the ferroelectric material to completely depolarize the capacitor. However, high temperatures might generate changes to the product and impact the performance of the circuits. In practice, the temperature should be in the range of 200° C.-350° C. A short thermal depolarization predetermined period of time is preferred as long as the wafers reach the desired temperature. In practice, five minutes to ten minutes are enough. The limitation of thermal depoling is that thermal depoling is a global effect; therefore, every ferroelectric capacitor in the die is depolarized and data is erased. Thermal depolarization method is used when no data is needed to be kept during the assembling process. For more advanced F-RAM, engineering data are stored in configuration bits where the data should be kept through the assembling process. Electrical depolarization according to an embodiment of the present invention, therefore, is recommended.

Figure 5:
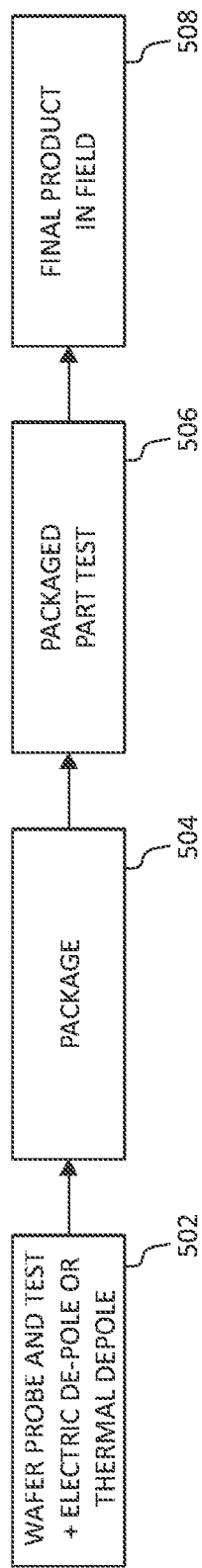
FIG. 5 is a new test and packaging flow according to an embodiment of the present invention.

FIG. 5 is entitled "New Test and Packaging Flow". The flow chart of FIG. 5 includes the steps of wafer probe and test, as well as electrical de-pole or thermal de-pole 502 of the good ferroelectric memories, package 504, packaged part test 506 for testing the packaged ferroelectric memories, and final product in field 508. As previously described, thermal de-pole can be achieved by placing ferroelectric memory wafers in an oven for a predetermined time. The temperature ramp up and ramp down rates are not critical as long as wafers are mechanically safe. The temperature range is 200° C. to 350° C. The bake time is in the range of 5 minutes to 10 minutes.

Electrical depolarization can be achieved, by attenuating the magnitude of positive and negative input pulses on the ferroelectric capacitors; this results in very little to no net polarization. This technique is illustrated in FIGS. 2(a), 2(b), 2(c), and 2(d) using sine-waves, square-waves, or triangle-waves. However, in practical device applications the minimum pulse voltages are limited to the CMOS and ferroelectric device operating limits since pulses cannot be applied directly to the capacitor electrodes from an external source. For example, for a 3V F-RAM device, whose normal operating range is 2.7-3.6V, the circuitry is expected to operate down to about 2V. Below this level, the pulses are unlikely to get reliably transmitted to the electrodes since the control circuitry will run out of operating margin due to device thresholds. Using these voltages as an example, the electrical depolarization thus proceeds down gradually from a maximum allowed voltage that is specific to the ferroelectric memory process used. The time scales in FIGS. 2(a)-2(e) are arbitrary, depending on the specific design used. The pulse widths are approximately 25 ns in general, but can again be changed for a specific implementation. FIG. 2(d) shows decreasing square-wave pulses to electrically depolarize the F-RAM capacitors. The pulses are defined with pre-determined ramping-up and ramping-down rates that can again be changed as desired for a specific implementation. The last pulse is slightly higher than the minimum CMOS operation voltage (2V for a 3V device). The last pulse is also positive.

It is important to note that the non-switching term is stored in the ferroelectric capacitors during packaging. When the write pulse and read pulse are in the same polarity, the stored term is non-switching. The read pulse is always positive. The last pulse should be in the same polarity as read pulse, i.e. positive. As known in the art, the plate line is used to receive the read and the write pulses. The existing plate lines, word lines, and bit lines associated with each ferroelectric memory cell in the ferroelectric memory can be used to administer the electrical depoling of the present invention. The exact timing, pulse height and width, can be determined by general purpose control circuitry found on the ferroelectric memory.

In general, the slower the voltage attenuation, the more effective the electrical depolarization. However, slower voltage attenuation takes more pulses and subsequently a longer time for electrical depolarization. An alternative simple technique employs only two pulses: a strong write pulse followed by a weak write pulse in the opposite direction as illustrated in FIG. 2(e). If the weak write pulse voltage is greater than the minimum operating voltage ($VDD_{min}$), no special action is needed. For the case that the weak write pulse voltage is lower than $VDD_{min}$, it may be necessary to employ a test mode specifically for this purpose.

Normally, the part is designed with safeguards in place to prevent the user from performing low-voltage writes since these will degrade reliability. But for cases where the part needs to operate below $VDD_{min}$, a test mode is designed into the part for use by the manufacturing group only. In this case, once the test mode is invoked, the part will continue to operate as VDD is decreased so that the low voltage pulses can be applied to the ferroelectric caps. There is still a lower limit in operating voltage that cannot be disabled since below that point, state latches will not be reliable and the part will not function predictably.

It is important to control the polarization at the end of electrical depolarization. For bottom electrode driven F-RAM, the last pulse of electrical depolarization should be a positive pulse on the bottom electrode. For top electrode driven F-RAM, the last pulse of electrical depolarization should be a positive pulse on the top electrode. The principle is that the polarity of last depolarization pulse and the read pulse should be the same. Therefore, it is always desirable to leave the non-switched term in the ferroelectric capacitor during assembly. Using this technique zero margin loss through the plastic packaging assembly process as compared to up to 50% opposite-state signal margin loss on fully polarized capacitors has been demonstrated.

Each of the waveforms shown in FIGS. 2(a)-(e) can be generated on-chip in an F-RAM device. Test modes of varying complexity can be designed into the part to achieve any of these approaches. As mentioned above, there is a limitation on the minimum voltage level that can be practically achieved.

Generating sinusoidal and triangle waveforms as shown in FIGS. 2(a) and 2(c), respectively, internal to the part requires additional circuitry that is not usually present in F-RAM control logic. Conversely, generating the waveforms shown in FIGS. 2(b) and 2(d) are easier with the logic normally associated with F-RAM control.

Another consideration, however, is the time required during wafer testing ferroelectric memories to execute these waveforms. To access each block of ferroelectric capacitors and apply the waveform will require a significant amount of time. A test mode can be designed into the part to access as many capacitors simultaneously as possible (even the entire chip). However, the perceived time gained in doing this is offset by the reduced speed of operation due to additional capacitive loading of accessing large blocks. In the interest of economics, it is important to minimize the amount of time on the tester and yet still improve the overall reliability of the part.

A preferred embodiment of the present invention for minimizing test time involves implementing the waveform in FIG. 2(e). This requires a test mode to allow low voltage writes but no special waveform generation. This method has been proven in manufacturing to require a minimal amount of time on the tester and a substantial improvement in package yield.

While there have been described above the principles of an embodiment of the present invention in conjunction with specific implementations of a ferroelectric memory in accordance with an embodiment of the present invention, it is to be clearly understood that the foregoing description is made only by way of example and not as a limitation to the scope of the invention. Particularly, it is recognized that the teachings of the foregoing disclosure will suggest other modifications to those persons skilled in the relevant art. Such modifications may involve other features which are already known per se and which may be used instead of or in addition to features already described herein.

Although claims have been formulated in this application to particular combinations of features, it should be understood that the scope of the disclosure herein also includes any novel feature or any novel combination of features disclosed either explicitly or implicitly or any generalization or modification thereof which would be apparent to persons skilled in the relevant art, whether or not such relates to the same invention as presently claimed in any claim and whether or not it mitigates any or all of the same technical problems as confronted by the present invention. The applicants hereby reserve the right to formulate new claims to such features and/or combinations of such features during the prosecution of the present application or of any further application derived therefrom.

We claim:

1. A method of minimizing imprint in a ferroelectric capacitor comprising using an AC field to electrically depole the ferroelectric capacitor before being packaged, wherein the AC field is generated using a series of two voltage pulses including a first strong voltage pulse followed by a second weak voltage pulse, wherein the second weak voltage pulse comprises a voltage less than a minimum operating voltage of the ferroelectric capacitor.

2. The method of claim 1 wherein the first strong voltage pulse comprises a maximum allowed voltage of the ferroelectric capacitor and the second weak voltage pulse does not exceed a minimum allowed voltage.

3. The method of claim 1 wherein the second voltage pulse is a positive voltage.

4. The method of claim 1 wherein the ferroelectric capacitor resides in a ferroelectric memory cell.

5. The method of claim 1 wherein the first strong voltage pulse and the second weak voltage pulse are write pulses.

6. The method of claim 1 wherein the second weak voltage pulse comprises a voltage of an opposite polarity a voltage of the first strong voltage pulse.

7. The method of claim 1 wherein the first strong voltage pulse and the second weak voltage pulse are write pulses generated on-chip in the ferroelectric memory.

8. The method of claim 1 wherein the first strong voltage pulse and the second weak voltage pulse are generated on-chip in the ferroelectric memory using a test mode.

9. A testing and packaging method for a ferroelectric memory comprising:
    wafer probing and testing ferroelectric memories to provide a subset of good ferroelectric memories;
    depoling the good ferroelectric memories;
    packaging the good ferroelectric memories; and
    testing the packaged ferroelectric memories,
    wherein depoling comprises electrically depoling by impressing an AC electric field across at least one ferroelectric capacitor in a memory cell of the ferroelectric memory, the AC field is generated using a series of two voltage pulses including a first strong voltage pulse followed by a second weak voltage pulse, and wherein the first strong voltage pulse comprises a maximum allowed operating voltage of the ferroelectric memory, and the second weak voltage pulse comprises a voltage less than a minimum operating voltage of the ferroelectric memory.

10. The method of claim 9 wherein the first strong voltage pulse comprises a maximum allowed voltage of the ferroelectric memory and the second weak voltage pulse does not exceed a minimum allowed voltage.

11. The method of claim 9 wherein the AC field is generated such that a final pulse is a positive voltage to minimize hydrogen degradation during packaging.

12. The method of claim 9 wherein depoling comprises thermally depoling at a predetermined temperature for a predetermined period of time.

13. The method of claim 12 wherein the predetermined temperature is higher than the packaging temperature.

14. The method of claim 12 wherein the predetermined temperature is in a range of 200° C. to 350° C.

15. The method of claim 12 wherein the predetermined time period is in a range of five to ten minutes.

* * * * *